(12) United States Patent
Lee

(10) Patent No.: US 12,288,793 B2
(45) Date of Patent: Apr. 29, 2025

(54) IMAGE SENSING DEVICE

(71) Applicant: SK hynix Inc., Icheon-si (KR)

(72) Inventor: Eun Khwang Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 301 days.

(21) Appl. No.: 17/858,665

(22) Filed: Jul. 6, 2022

(65) Prior Publication Data

US 2023/0130219 A1 Apr. 27, 2023

(30) Foreign Application Priority Data

Oct. 22, 2021 (KR) .................. 10-2021-0142106

(51) Int. Cl.
*H01L 27/146* (2006.01)
*H04N 25/59* (2023.01)

(52) U.S. Cl.
CPC .. *H01L 27/14603* (2013.01); *H01L 27/14616* (2013.01); *H01L 27/14641* (2013.01); *H04N 25/59* (2023.01)

(58) Field of Classification Search
CPC ......... H01L 27/14603; H01L 27/14616; H01L 27/14641; H04N 25/59
USPC ........................................... 348/308
See application file for complete search history.

(56) References Cited

U.S. PATENT DOCUMENTS

| 8,988,570 B2 | 3/2015 | Barbier |
| 2004/0079977 A1 | 4/2004 | Ying et al. |
| 2019/0386057 A1 | 12/2019 | Wang et al. |
| 2021/0006761 A1* | 1/2021 | Choi .................. H04N 25/534 |

FOREIGN PATENT DOCUMENTS

| CN | 108270980 A | 7/2018 |
| CN | 110035242 A | 7/2019 |
| CN | 113224087 A | 8/2021 |
| JP | 2013009207 A | 1/2013 |
| JP | 2018121301 A | 8/2018 |
| WO | 2021166584 A1 | 8/2021 |

OTHER PUBLICATIONS

CN Office Action for CN Appl. No. 202210766400.8, mailed on Oct. 23, 2024, 6 pages.

* cited by examiner

*Primary Examiner* — Joel W Fosselman
(74) *Attorney, Agent, or Firm* — Perkins Coie LLP

(57) ABSTRACT

An image sensing device includes a pixel array of a plurality of unit pixels arranged in a row direction and a column direction and including a first unit pixel that includes floating diffusion region configured to store photocharge generated within the first unit pixel in corresponding to incident light; a first gain conversion transistor connected to the first floating diffusion region; a first row booster block connected to the first gain conversion transistor and a second gain conversion transistor that is included in a second unit pixel adjacent to the first unit pixel in the row direction; and a first column booster block connected to the first gain conversion transistor and a third gain conversion transistor that is included in a third unit pixel adjacent to the first unit pixel in the column direction.

12 Claims, 7 Drawing Sheets

1.

| CB11(off) | | RB12 | |
|---|---|---|---|
| | | on | off |
| RB11 | on | 6C | 4C |
| | off | X | 2C |

2.

| CB11(on) | | RB12 | |
|---|---|---|---|
| | | on | off |
| RB11 | on | 12C | 8C |
| | off | X | 4C |

FIG.6

IMAGE SENSING DEVICE

CROSS-REFERENCE TO RELATED APPLICATION

This patent document claims the priority and benefits of Korean patent application No. 10-2021-0142106, filed on Oct. 22, 2021, the disclosure of which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductive material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device capable of adjusting a conversion gain.

In accordance with an embodiment of the disclosed technology, an image sensing device may include a pixel array of a plurality of unit pixels arranged in a row direction and a column direction and including a first unit pixel that includes a first floating diffusion region configured to store photocharge generated within the first unit pixel in corresponding to incident light, a first gain conversion transistor connected to the first floating diffusion region, a first row booster block connected to the first gain conversion transistor and a second gain conversion transistor that is included in a second unit pixel adjacent to the first unit pixel in the row direction, and a first column booster block connected to the first gain conversion transistor and a third gain conversion transistor that is included in a third unit pixel adjacent to the first unit pixel in the column direction.

In some implementations, the first column booster block is configured to receive a first horizontal column booster signal commonly applied to a plurality of column booster blocks respectively included in the plurality of unit pixels adjacent to each other in the row direction and a first vertical column booster signal commonly applied to a plurality of column booster blocks respectively included in the plurality of unit pixels adjacent to each other in the column direction.

In some implementations, the first row booster block is configured in a manner that a first row booster signal is commonly applied to a plurality of row booster blocks respectively included in the plurality of unit pixels adjacent to each other in the column direction.

In some implementations, in response to the first horizontal column booster signal having an activation voltage and the first vertical column booster signal having an activation voltage, the first column booster block electrically interconnects the first gain conversion transistor and the third gain conversion transistor.

In some implementations, in response to the first row booster signal having an activation voltage, the first row booster block electrically interconnects the first gain conversion transistor and the second gain conversion transistor.

In some implementations, the first column booster block includes a first horizontal column booster transistor configured to receive the first horizontal column booster signal as an input and a first vertical column booster transistor configured to receive the first vertical column booster signal as an input, wherein one end of the first horizontal column booster transistor is connected to one end of the first vertical column booster transistor.

In some implementations, the first horizontal column booster transistor includes a first drain region and a first source region, the first vertical column booster transistor includes a second drain region and a second source region and the first drain region and the second source region are identical to each other.

In some implementations, the first unit pixel includes four photoelectric conversion elements each of the photoelectric conversion elements is connected to the first floating diffusion region and the photoelectric conversion elements are arranged in a (2×2) matrix array.

In some implementations, capacitance of the first row booster block or the first column booster block is smaller than capacitance of the first gain conversion transistor, the second gain conversion transistor, or the third gain conversion transistor.

In some implementations, the second unit pixel includes a second floating diffusion region and the second floating diffusion region is connected to the second gain conversion transistor.

In some implementations, the third unit pixel includes a third floating diffusion region, wherein the third floating diffusion region is connected to the third gain conversion transistor.

In some implementations, the first gain conversion transistor and the second gain conversion transistor are configured to receive the same signal as an input.

In accordance with another embodiment of the disclosed technology, an image sensing device may include a plurality of unit pixels arranged in a row direction and a column direction of a pixel array, wherein the plurality of unit pixels includes a first unit pixel that includes a first signal block including a plurality of elements and configured to output a first pixel signal corresponding to incident light, and a first connection block configured to connect the first signal block with one or more signal blocks included in other unit pixels than the first unit pixel based on control signals applied to the first connection block, and wherein a number of the one or more signal blocks connected to the first signal block depends on the control signals.

In some other implementations, the first connection block is configured to connect a second signal block included in a second unit pixel adjacent to the first unit pixel in a row direction to the first signal block, and configured to connect a third signal block included in a third unit pixel adjacent to the first unit pixel in a column direction to the first signal block.

In some other implementations, the first connection block includes a first row booster block through which a second signal block included in a second unit pixel adjacent to the first unit pixel in a row direction is connected to the first signal block and a first column booster block through which a third signal block included in a third unit pixel adjacent to the first unit pixel in a column direction is connected to the first signal block.

In some other implementations, the control signals include a first horizontal column booster signal and a first vertical column booster signal that allow, when both activated, the first signal block to be connected to the third signal block.

In some other implementations, the control signals include a first row booster signal that allows, when activated, the first signal block to be connected with the second signal block.

In some other implementations, the first row booster signal is applied to the first row booster block included in the first unit pixel and a row booster block included in another unit pixels adjacent to the first unit pixel in the column direction.

In some other implementations, the plurality of elements includes a photoelectric conversion region configured to generate photocharges in response to the incident light, and a floating diffusion region configured to receive the photocharges and store the photocharges.

In some other implementations, the floating diffusion region has capacitances that depend on the number of the one or more signal blocks connected to the first signal block.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIG. 6 is a diagram illustrating tables for explaining a method for adjusting a conversion gain of a floating diffusion region based on some implementations of the disclosed technology.

DETAILED DESCRIPTION

This patent document provides implementations and examples of image sensing device designs that may be used in configurations to substantially address one or more technical or engineering issues and to mitigate limitations or disadvantages encountered in some other image sensing device designs. Some implementations of the disclosed technology relate to an image sensing device which can adjust a conversion gain. The disclosed technology provides the image sensing device which can sufficiently acquire a conversion gain of a floating diffusion region included in each unit pixel while miniaturizing the unit pixel. The disclosed technology provides the image sensing device which can obtain a high dynamic range (HDR) image by adjusting a conversion gain of the floating diffusion region.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter. However, it should be understood that the disclosed technology is not limited to specific embodiments, but includes various modifications, equivalents and/or alternatives of the embodiments.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
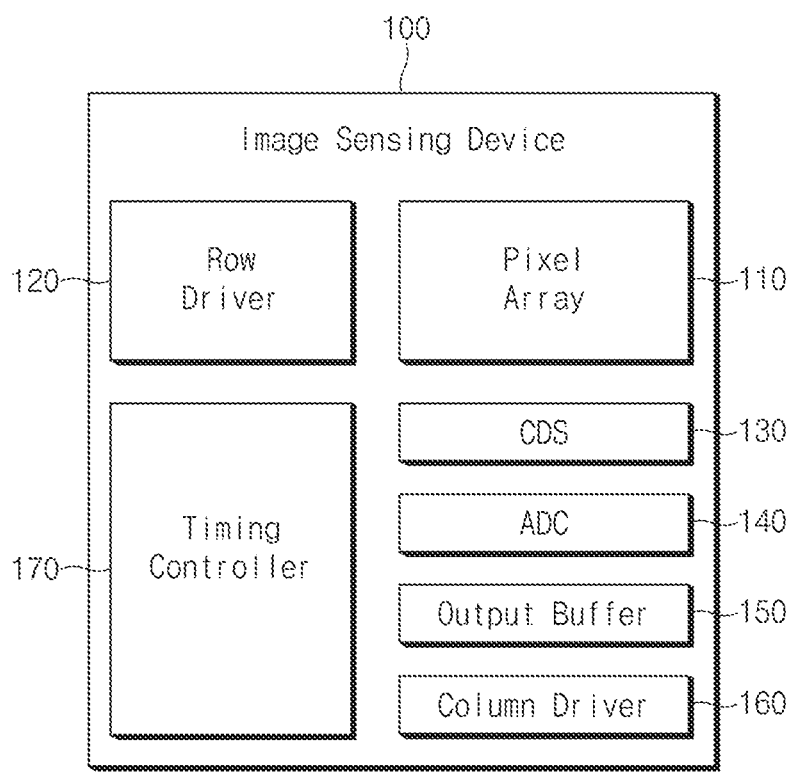
FIG. 1 is a block diagram illustrating an example of an image sensing device based on some implementations of the disclosed technology.

FIG. 1 is a block diagram illustrating an image sensing device 100 based on some implementations of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit pixels arranged in rows and columns. In one example, the plurality of unit imaging pixels can be arranged in a two dimensional pixel array including rows and columns.

In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry.

The pixel array 110 may receive driving signals, including a row selection signal, a pixel reset signal and a transmission signal, from the row driver 120. Upon receiving the driving signal, corresponding pixels in the pixel array 110 may be activated to perform the operations corresponding to the row selection signal, the pixel reset signal, and the transmission signal.

The row driver 120 may activate the pixel array 110 to perform certain operations on the pixels in the corresponding row based on commands and control signals provided by controller circuitry such as the timing controller 170. In some implementations, the row driver 120 may select one or more pixels arranged in one or more rows of the pixel array 110. The row driver 120 may generate a row selection signal to select one or more rows among the plurality of rows.

The row decoder 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of a pixel (e.g., a node connected to a floating diffusion node) is reset, and the image signal may be an electrical signal that is provided to the CDS 130 when photocharges generated by the pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer for counting until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data from the selected column of the output buffer 150as an output signal.

The timing controller 170 may control operations of at least one of the row driver 120, the ADC 140, the output buffer 150, and the column driver 160.

The timing controller 170 may provide the row driver 120, the CDS 130, the ADC 140, the output buffer 150, and the column driver 160 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
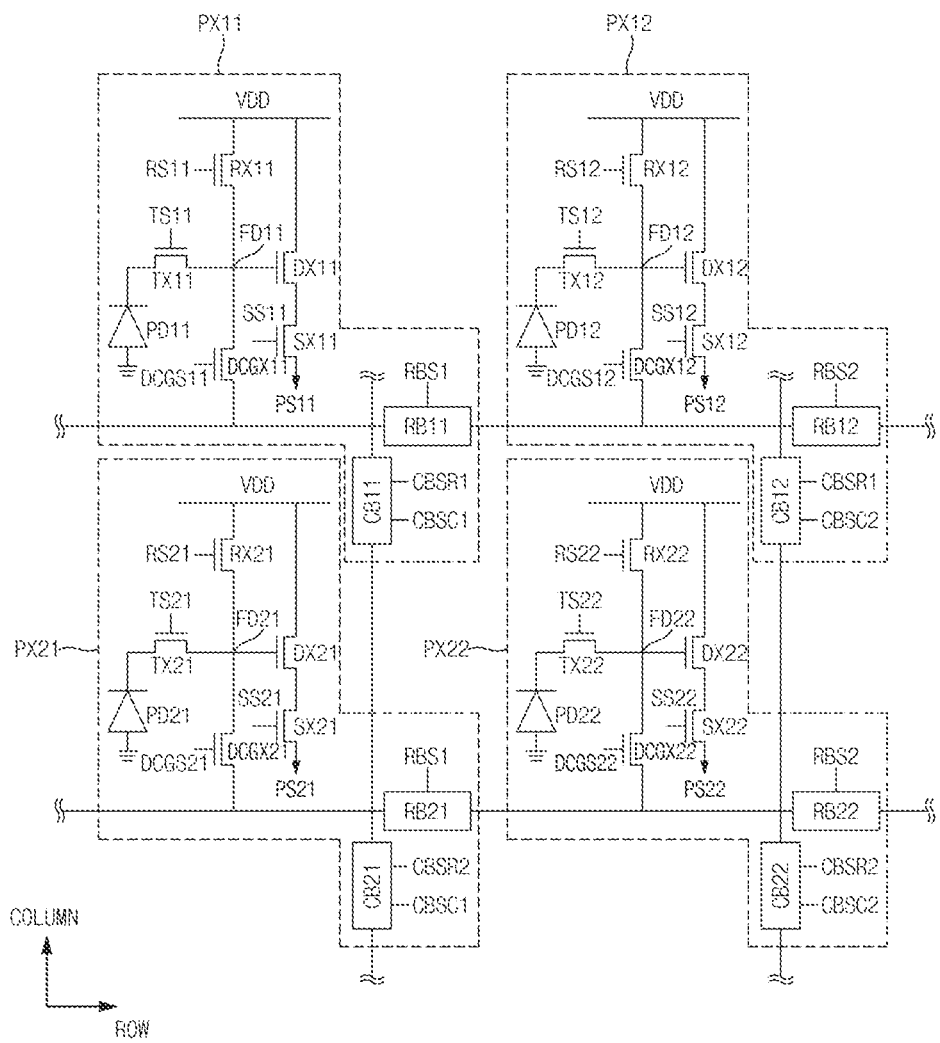
FIG. 2 is an example of an equivalent circuit illustrating a portion of a pixel array based on some implementations of the disclosed technology.

FIG. 2 is an example of an equivalent circuit illustrating a portion of a pixel array 110 based on some implementations of the disclosed technology.

FIG. 2 illustrates the connection relationship between a plurality of unit pixels PX11, PX12, PX21, and PX22 and constituent elements respectively included in the plurality of unit pixels PX11, PX12, PX21, and PX22.

The plurality of unit pixels PX11, PX12, PX21, and PX22 may be disposed adjacent to each other in row and column directions of the pixel array 110.

Referring to FIG. 2, a unit pixel located at a first-row-and-first-column position of the pixel array may be referred to as a first unit pixel PX11. A unit pixel located at a first-row-and-second-column position of the pixel array while being adjacent to the first unit pixel PX11 in the row direction may be referred to as a second unit pixel PX12. A unit pixel located at a second-row-and-first-column position of the pixel array while being adjacent to the first unit pixel PX11 in the column direction may be referred to as a third unit pixel PX21. In addition, a unit pixel located at a second-row-and-second-column position of the pixel array may be referred to as a fourth unit pixel PX22.

Unit pixels included in the pixel array, which include the first unit pixel PX11 to the fourth unit pixels PX22, may have the same structure as one another and may include the same elements. Thus, the description provided for the first unit pixel PX11 can be applied to other unit pixels as well. Redundant descriptions will herein be omitted.

The first unit pixel PX11 may include a first photoelectric conversion region PD11 that converts light into photocharge, a first transfer transistor TX11 coupled to the PD11 to transfer the photocharge out of the PD11 to be stored in a first floating diffusion region FD11, a first gain conversion transistor DCGX11 coupled to the FD11 to produce the pixel output, a first drive transistor DX11, and a first selection transistor SX11. The first unit pixel PX11 may include a first row booster block RB11 and a first column booster block CB11.

A block including the first photoelectric conversion region PD11, the first transfer transistor TX11, the first floating diffusion region FD11, the first gain conversion transistor DCGX11, the first drive transistor DX11, and the first selection transistor SX11 may be referred to as a first signal block. In addition, a block including the first row booster block RB11 and the first column booster block CB11 may be referred to as a first connection block. The first unit pixel PX11 may include a first signal block and a first connection block.

The first photoelectric conversion region PD11 may generate photocharges corresponding to incident light. The first photoelectric conversion region PD11 may include an organic or inorganic photodiode. In some implementations, the first photoelectric conversion region PD11 may include a photosensitive element such as a photogate in addition to a photodiode. In some implementations, the first photoelectric conversion region PD11 may include a plurality of impurity regions vertically stacked in the semiconductor substrate.

The first transfer transistor TX11 may transmit photocharges generated in the first photoelectric conversion region PD11 to the first floating diffusion region FD11 according to the first transmission signal TS11 applied to the first transfer transistor TX11.

For example, the first transmission signal TS11 may have a voltage of an activation level, which is referred to as an activation voltage, or a voltage of a deactivation level, which is referred to as a deactivation voltage. When the first transmission signal TS11 having an activation voltage is applied to the first transfer transistor TX11, photocharges may move from the first photoelectric conversion region PD11 to the first floating diffusion region FD11.

The first floating diffusion region FD11 may receive photocharges generated in the first photoelectric conversion region PD11, and may store the received photocharges. The first floating diffusion region FD11 may be an element having a predetermined capacitance.

A conversion gain of the first floating diffusion region FD11 may vary depending on the capacitance of the first floating diffusion region FD11.

The conversion gain may refer to a gain obtained when photocharges focused on the floating diffusion region is converted into a voltage. As the capacitance of a node corresponding to the floating diffusion region increases, a conversion gain of the floating diffusion region may decrease. The capacitance of the node corresponding to the floating diffusion region may be equal to the sum of capacitances of devices connected to the floating diffusion region.

In some implementations, in the high-illuminance operating environment in which a large amount of photocharges generates in a photoelectric conversion region, the operation voltage range of the image sensing device may expand only when the capacitance of the floating diffusion region is large and the conversion gain is low.

In addition, in the low-illuminance operating environment in which a small amount of photocharges generates, a pixel signal corresponding to a small amount of incident light can be easily output only when the capacitance of the floating diffusion region is small and the conversion gain is large.

The capacitance of the floating diffusion region may be equal to the sum of total capacitances of the devices connected to the floating diffusion region.

The first drive transistor DX11 may amplify a voltage signal corresponding to photocharges stored in the first floating diffusion region FD11 to generate the first pixel signal PS11.

The generated first pixel signal PS11 may be output through the first selection transistor SX11. Whether to output the first pixel signal PS11 may be determined according to the voltage level of the first selection signal SS11 applied to the first selection transistor SX11.

The first floating diffusion region FD11 may be connected to one end of the first reset transistor RX11, and the pixel voltage VDD may be connected to the other end of the first reset transistor RX11.

Devices included in the first unit pixel PX11 may be reset to the pixel voltage VDD according to a voltage level of the first reset signal RS11 applied to the first reset transistor RX11.

For example, when the first reset signal RS11 has an activation voltage, the first photoelectric conversion region PD11, the first transfer transistor TS11, the first floating diffusion region FD11, and the first gain conversion transistor DCGX11, which are included in the first unit pixel PX11, may be reset to the pixel voltage VDD.

At a timing point where the first reset signal RS11 has an activation voltage, the first transmission signal TS11, the first selection signal SS11, and the first gain conversion signal DCGS11 may have an activation voltage.

One end of the first gain conversion transistor DCGX11 may be connected to the first floating diffusion region FD11, and the other end of the first gain conversion transistor DCGX11 may be connected to the first row booster block RB11 and the first column booster block CB11.

The first gain conversion transistor DCGX11 may have a predetermined capacitance. In some implementations, the capacitance of the first gain conversion transistor DCGX11 may be the same as the capacitance of the first floating diffusion region FD11.

The sum of capacitances of the devices connected to the first floating diffusion region FD11 may be changed according to the voltage level of the first gain conversion signal DCGS11 applied to the first gain conversion transistor DCGX11.

For example, when the first gain conversion signal DCGS11 has an activation voltage, the first floating diffusion region FD11 and the first gain conversion transistor DCGX11 are connected to each other, and the capacitance of the node corresponding to the first floating diffusion region FD11 may increase. Accordingly, the amount of photocharges capable of being stored in the first floating diffusion region FD11 can increase.

Therefore, when the image sensing device operates in the high-illuminance environment, the image sensing device receives the first gain conversion signal DCGS11 having an activation voltage, so that the number of devices connected to the first floating diffusion region FD11 may increase. As the number of devices connected to the first floating diffusion region FD11 increases, the capacitance of the node corresponding to the first floating diffusion region FD11 may increase.

The first row booster block RB11 may connect the first gain conversion transistor DCGX11 included in the first unit pixel PX11 to the second gain conversion transistor DCGX12 included in the second unit pixel PX12 that is adjacent to the first unit pixel PX11 in the row direction.

As the first gain conversion transistor DCGX11 and the second gain conversion transistor DCGX12 are connected through the first row booster block RB11, the first gain conversion transistor DCGX11, the second gain conversion transistor DCGX12, and the second floating diffusion region FD12 are connected to the first floating diffusion region FD11.

When the first row booster signal RBS1 applied to the first row booster block RB11 has an activation voltage, gain conversion transistors respectively included in unit pixels that are adjacent to each other in the row direction may be connected to each other. The number of devices connected to the floating diffusion region can be adjusted by controlling whether to connect the gain conversion transistors to each other.

For convenience of description, it is assumed that the first row booster block RB11 has a small capacitance that can be negligible compared to capacitances of the floating diffusion regions or capacitances of the gain conversion transistors.

In some implementations, the gain conversion signals applied to the gain conversion transistors respectively included in the unit pixels adjacent to each other in the row direction may be identical to each other. The signals applied to the gain conversion transistors respectively included in the unit pixels adjacent to each other in the row direction may be equal to each other.

For example, the first gain conversion signal DCGS11 applied to the first gain conversion transistor DCGX11 included in the first unit pixel PX11 may be the same signal as the second gain conversion signal DCGS12 applied to the second gain conversion transistor DCGX12 included in the second unit pixel PX12.

When each of the first gain conversion signal DCGS11 and the second gain conversion signal DCGS12 has an activation voltage and the first row booster signal RBS1 has an activation voltage, the first floating diffusion region FD11, the first gain conversion transistor DCGX11, the second gain conversion transistor DCGX12, and the second floating diffusion region FD12 may be connected to one another.

For convenience of explanation, it may be assumed that the first floating diffusion region FD11, the first gain conversion transistor DCGX11, the second gain conversion transistor DCGX12, and the second floating diffusion region FD12 have the same capacitance. However, the scope of the disclosed technology is not limited thereto. Thus, in some implementations, the first floating diffusion region FD11, the first gain conversion transistor DCGX11, the second gain conversion transistor DCGX12, and the second floating diffusion region FD12 have different capacitances from one another.

When the above-described devices are connected through the first row booster block RB11, the total capacitance of the first floating diffusion region FD11 may be four times the capacitance of the first floating diffusion region FD11 when the first gain conversion signal DCGS11 and the second gain conversion signal DCGS12 does not have an activation voltage.

The row booster signals applied to the row booster blocks respectively included in the unit pixels arranged in the same column in the pixel array may be equal to each other. Thus, the row booster signal lines connected to the row booster blocks respectively included in the unit pixels arranged in the same column may be equal to each other.

For example, the signal applied to the first row booster block RB11 included in the first unit pixel PX11 may be the same as the signal applied to the third row booster block RB21 included in the third unit pixel PX21, and the signal may be referred to as the first row booster signal RBS1. The row booster blocks included in the unit pixels arranged in the same column from among the unit pixels arranged in the pixel array can be activated or deactivated at the same time.

The first column booster block CB11 may connect the first gain conversion transistor DCGX11 included in the first unit pixel PX11 to the third gain conversion transistor DCGX21 included in the third unit pixel PX21 adjacent to the first unit pixel PX11 in the column direction.

As the first gain conversion transistor DCGX11 and the third gain conversion transistor DCGX21 are connected through the first column booster block CB11, the first gain conversion transistor DCGX11, the third gain conversion transistor DCGX21, and the third floating diffusion region FD21 may be connected to the first floating diffusion region FD11.

The first column booster block CB11 may receive a first horizontal column booster signal CBSR1 and a first vertical column booster signal CBSC1.

When both the first horizontal column booster signal CBSR1 and the first vertical column booster signal CBSC1 have an activation voltage, gain conversion transistors respectively included in unit pixels that are adjacent to each other in the column direction may be connected to each other. By controlling the connections of the gain conversion transistors such that the gain conversion transistors of the unit pixels are connected or not connected, the number of devices connected to the floating diffusion region in one unit pixel can be adjusted, and the capacitance of the floating diffusion region in the unit pixel can also be adjusted.

In some implementations, the first column booster block CB11 may have a small capacitance that may be negligible compared to capacitances of the floating diffusion regions or capacitances of the gain conversion transistors.

When each of the first and third gain conversion signals DCGS11 and DCGS21 has an activation voltage, and each of the first horizontal column booster signal CBSR1 and the first vertical column booster signal CBSC1 has an activation voltage, the first floating diffusion region FD11, the first gain conversion transistor DCGX11, the third gain conversion transistor DCGX21, and the third floating diffusion region FD21 may be connected to each other.

The first column booster block CB11 may interconnect the first gain conversion transistor DCGX11 and the third gain conversion transistor DCGX21 only when each of the first horizontal column booster signal CBSR1 and the first vertical column booster signal CBSC1 has an activation voltage.

In some implementations, the first floating diffusion region FD11, the first gain conversion transistor DCGX11, the third gain conversion transistor DCGX21, and the third floating diffusion region FD21 may have the same capacitance. Therefore, when the devices are connected by the first column booster block CB11, total capacitance of the first floating diffusion region FD11 may be increased by four times compared to a case where the above-described devices are not interconnected by the first column booster block CB11.

The horizontal column booster signals applied to the column booster blocks respectively included in the unit pixels arranged in the same row in the pixel array may be equal to each other. Thus, the horizontal column booster signals applied to the column booster blocks respectively included in the unit pixels adjacent to each other in the row direction may be equal to each other.

As shown in FIG. 2, the first horizontal column booster signal CBSR1 may be commonly applied not only to the first column booster block CB11 included in the first unit pixel PX11, but also to the second column booster block CB12 included in the second unit pixel PX12 arranged in the same row as the first unit pixel PX11. The column booster signal may be commonly applied to the plurality of column booster blocks respectively included in the plurality of unit pixels adjacent to each other in the row direction.

The vertical column booster signals applied to the column booster blocks respectively included in the unit pixels arranged in the same column in the pixel array may be equal to each other. The vertical column booster signals applied to the column booster blocks respectively included in the plurality of unit pixels adjacent to each other in the column direction may be equal to each other.

As shown in FIG. 2, the first vertical column booster signal CBSC1 may be commonly applied not only to the first column booster block CB11 included in the first unit pixel PX11, but also to the third column booster block CB21 included in the third unit pixel PX21 that is adjacent to the first unit pixel PX11 in the column direction and arranged in the same column as in the first unit pixel PX11. Thus, a column booster signal may be commonly applied to the column booster blocks respectively included in the unit pixels adjacent to each other in the column direction.

In a situation where the column booster block is in contact with one signal line applying the same horizontal column booster signal to column booster blocks arranged in the row direction and the other signal line applying the same vertical column booster signal to column booster blocks arranged in the column direction, only when signals received through the two signal lines have an activation voltage, the column booster block can interconnect two gain conversion transistors that are adjacent to each other in the column direction, so that the column booster blocks respectively included in different unit pixels can be independently activated.

The activation of the column booster block may allow gain conversion transistors connected to both ends of the column booster to be electrically connected to each other.

For example, when both the first horizontal column booster signal CBSR1 and the first vertical column booster signal CBSR1 have an activation voltage, the first column booster block CB11 included in the first unit pixel PX11 may be activated so that the first gain conversion transistor DCGX11 and the third gain conversion transistor DCGX21 can be connected to each other.

Although the first column booster block CB11 is activated, when the signal CBSC2 applied to the other signal line connected to the second column booster block CB12 included in the second unit pixel PX12 does not have an activation voltage, the second column booster block CB12 included in the second unit pixel may not be activated, and thus the second gain conversion transistor DCGX12 and the fourth gain conversion transistor DCGX22 may not be connected to each other.

Although the first column booster block CB11 is activated, when the signal CBSR2 applied to the other signal line connected to the third column booster block CB21 included in the third unit pixel PX21 does not have an activation voltage, the third column booster block CB21 included in the third unit pixel may not be activated, and the third gain conversion transistor DCGX21 and the other gain conversion transistor may not be connected to each other.

In some implementations, the unit pixel may include a row booster block for interconnecting gain conversion transistors respectively included in unit pixels adjacent to each other in a row direction, and a column booster block for interconnecting gain conversion transistors respectively included in unit pixels adjacent to each other in a column direction, thereby adjusting the number of devices connected to the floating diffusion region included in each unit pixel.

By adjusting the number of devices to be connected to the floating diffusion region, the conversion gain of the floating diffusion region can be adjusted, and images corresponding to the operation environment having various illuminance levels can be detected.

In addition, the image sensing device according to the disclosed technology may control the number of devices (e.g., the floating diffusion region or the gain conversion transistor of another unit pixel) to be connected to the floating diffusion region for each unit pixel so that the floating diffusion regions included in the unit pixels in the pixel array may have different conversion gains.

The image sensing device according to the disclosed technology can obtain an HDR image by performing image capture only once (i.e., one photographing action). The HDR image may generally refer to an image generated when a plurality of pixel signals for the environment having different illuminances is acquired and the acquired pixel signals are then synthesized and calculated.

The image sensing device according to the disclosed technology can adjust the floating diffusion regions respectively included in the unit pixels in the pixel array so that the floating diffusion regions can have different conversion gains, thereby acquiring pixel signals corresponding to the environment having different illuminances by only one photographing action.

The image sensing device may generate an HDR image by synthesizing and calculating image data based on the pixel signal.

Figure 3:
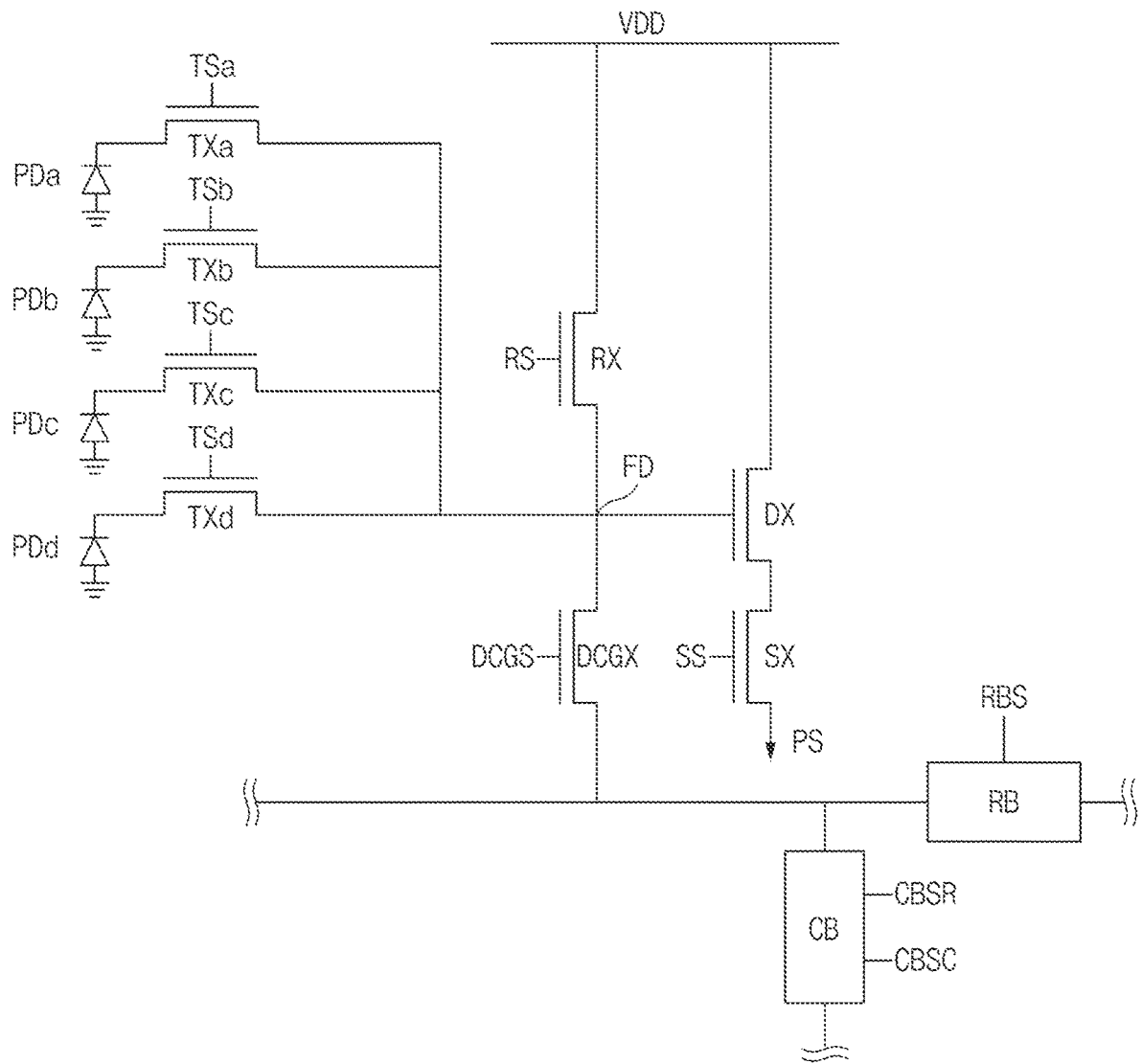
FIG. 3 is an example of an equivalent circuit illustrating an example of a unit pixel based on some other implementations of the disclosed technology.

FIG. 3 is an example of an equivalent circuit illustrating a unit pixel based on some other implementations of the disclosed technology.

In the example of FIG. 3, the unit pixel may be disposed in the pixel array. The unit pixel as shown in FIG. 3 has different structures from the first to fourth unit pixels PX11, PX12, PX21, and PX22 shown in FIG. 2 as discussed above.

The unit pixel may include four photoelectric conversion regions (PDa, PDb, PDc, PDd), four transfer transistors (TXa, TXb, TXc, TXd), a floating diffusion region FD, a drive transistor DX, a selection transistor SX, a reset transistor RX, a gain conversion transistor DCGX, a row booster block RB, and a column booster block CB.

The floating diffusion region FD, the drive transistor DX, the selection transistor SX, the reset transistor RX, the gain conversion transistor DCGX, the row booster block RB, and the column booster block CB shown in FIG. 3 are substantially the same as those described above with reference to FIG. 2, so that the above-described constituent elements shown in FIG. 3 will hereinafter be described centering upon the photoelectric conversion regions PDa, PDb, PDc, and PDd and the transfer transistors TXa, TXb, TXc, and TXd.

The photoelectric conversion regions PDa, PDb, PDc, and PDd may be connected to the transfer transistors TXa, TXb, TXc, and TXd, respectively. In addition, the transfer transistors TXa, TXb, TXc, and TXd may be connected to the floating diffusion region FD.

According to another embodiment, the photoelectric conversion regions PDa, PDb, PDc, and PDd included in the unit pixel may share the floating diffusion region FD, the drive transistor DX, the selection transistor SX, the reset transistor RX, the gain conversion transistor DCGX, the row booster block RB, and the column booster block CB.

The transmission signals TSa, TSb, TSc, and TSd respectively applied to the transfer transistors TXa, TXb, TXc, and TXd may be activated at different timing points from one another, so that the pixel signal PS corresponding to photocharges generated in each of the photoelectric conversion regions PDa, PDb, PDc, and PDd can be output.

In some implementations, when photocharges generated in each of the photoelectric conversion regions PDa, PDb, PDc, and PDd are transmitted to the floating diffusion region FD, each of the transmission signals TSa, TSb, TSc, and TSd may exclusively have an activation voltage. In some implementations, any two of the transmission signals TSa, TSb, TSc, and TSd do not overlap each other.

Since the plurality of photoelectric conversion regions PDa, PDb, PDc, and PDd is connected to one floating diffusion region FD, the number of transistors included in one unit pixel may decrease and the degree of freedom in a pixel layout can increase. In addition, a region where photoelectric conversion regions and transistors can be disposed may be secured.

Figure 4:
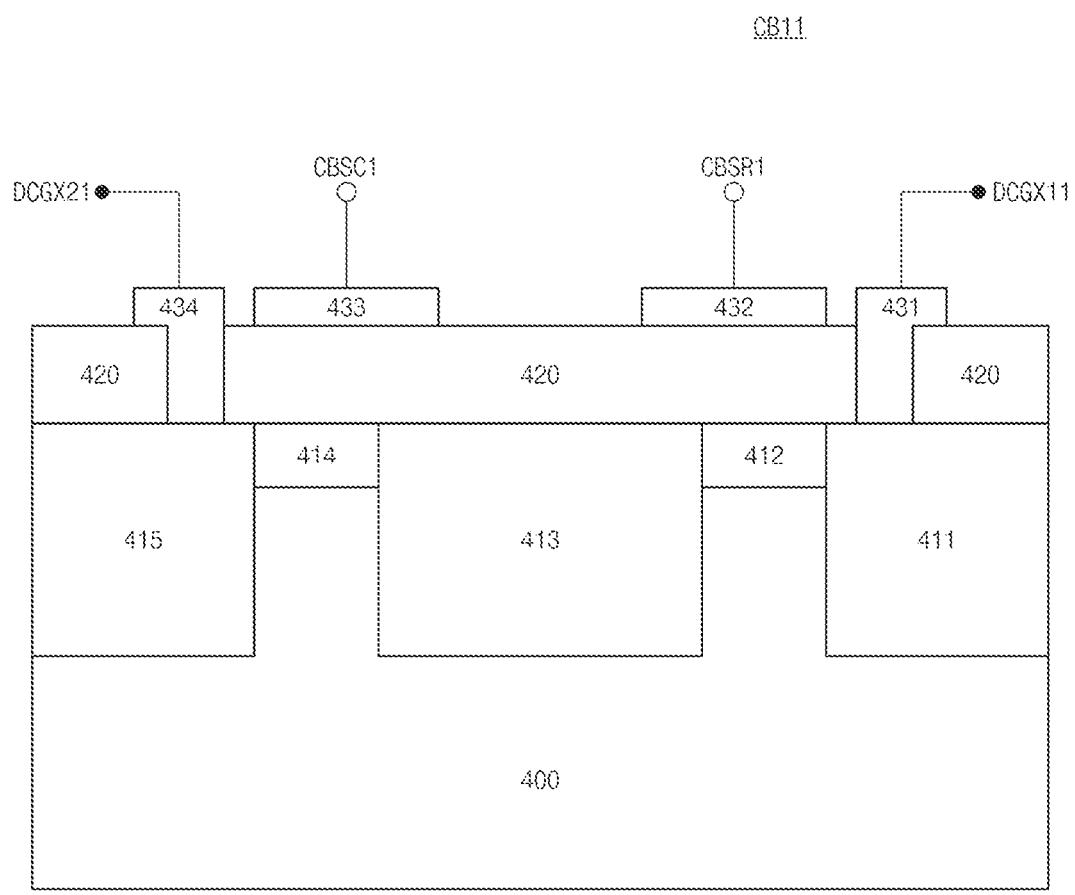
FIG. 4 is a cross-sectional view illustrating an example of a first column booster block based on some implementations of the disclosed technology.

FIG. 4 is a cross-sectional view illustrating an example of the first column booster block CB11 based on some implementations of the disclosed technology.

Although FIG. 4 is a cross-sectional view of the first column booster block CB11, other column booster blocks (e.g., CB12, CB21, CB22) shown in FIG. 2 may have the same cross-section as the first column booster block CB11.

The first column booster block CB11 may have a dual gate MOSFET structure. The dual gate MOSFET may include two gates, and a drain region included in one transistor may be used as a source region of another transistor.

The first column booster block CB11 may be formed over the semiconductor substrate 400. The semiconductor substrate 400 may include a silicon substrate doped with impurities or an epitaxial layer doped with impurities. For example, the semiconductor substrate 400 may be doped with P-type impurities.

The first column booster source region 411 may be formed over the semiconductor substrate 400, and may be a region doped with conductive-type impurities different from those of the semiconductor substrate 400. For example, the first column booster source region 411 may be a region doped with N-type impurities.

The first column booster channel region 412 may be formed to contact the first column booster source region 411, and may be a region doped with the same conductivity-type impurities as those of the first column booster source region 411. The first column booster channel region 412 may be doped at a lower density than the first column booster source region 411.

The first column booster drain region 413 may be doped with the same conductive-type impurities as the first column booster source region 411. In addition, the first column booster drain region 413 may be doped at the same density as the first column booster source region 411.

The second column booster channel region 414 may be formed to contact the first column booster drain region 413, and the second column booster channel region 414 may be doped with the same conductivity-type impurities as the first column booster drain region 413. The second column booster channel region 414 may be doped at a lower density than the first column booster drain region 414.

The second column booster drain region 415 may be doped with impurities of the same conductivity type as the first column booster drain region 413. The second column booster drain region 415 may be doped at the same density as in the first column booster drain region 413.

A column booster insulation layer 420 may be formed over the source regions, the drain regions, and the channel regions. For example, the column booster insulation layer may include an insulation material such as silicon oxide.

The first column booster terminal 431 formed through the column booster insulation layer 420 may be in contact with the first column booster source region 411. The first column booster terminal 431 may include a conductive material, for example, metal or polysilicon. The first column booster terminal 431 may extend to one end of the first column booster block CB11, and may be connected to the first gain conversion transistor DCGX11.

The first horizontal column booster transistor gate 432 may be formed over the column booster insulation layer 420, and may include a conductive material. In some implementations, at least a portion of the first horizontal column booster transistor gate 432 may be formed to overlap the first column booster source region 411 and the first column booster drain region 413.

A first horizontal column booster signal line may be connected to the first horizontal column booster transistor gate 432, and the first horizontal column booster signal line can be connected to the first horizontal column booster transistor gate 432 so that the first horizontal column booster signal CBSR1 can be applied to the first horizontal column booster transistor gate 432.

The first vertical column booster transistor gate 433 may be formed over the column booster insulation layer 420, and may include a conductive material. In some implementations, at least a portion of the first vertical column booster transistor gate 433 may be formed to overlap the first column booster drain region 413 and the second column booster drain region 415.

A first vertical column booster signal CBSC1 may be applied to the first vertical column booster transistor gate 433, and a first vertical column booster signal line may be connected to the first vertical column booster transistor gate 433 so that the first vertical column booster signal CBSC1 can be applied to the first vertical column booster transistor gate 433.

The second column booster terminal 434 may be formed through the column booster insulation layer 420, and may be in contact with the second column booster drain region 415. The second column booster terminal 434 may include a conductive material, for example, a metal material or polysilicon. The second column booster terminal 434 may extend to the other end of the first column booster block CB11 so that the second column booster terminal 434 can be connected to the third gain conversion transistor DCGX21.

The first column booster block CB11 according to an embodiment of the disclosed technology may include a first horizontal column booster transistor and a first vertical column booster transistor. The first horizontal column booster transistor may include a first horizontal column booster transistor gate 432, and the first vertical column booster transistor may include a first vertical column booster transistor gate 433.

The first horizontal column booster transistor may include a first column booster source region 411, a first column booster channel region 412, and a first column booster drain region 413.

When an activation voltage is applied to the first horizontal column booster transistor gate 432, charges may move from the first column booster source region 411 to the first column booster drain region 413 through the first column booster channel region 412.

The first vertical column booster transistor may include a first column booster drain region 413, a second column booster channel region 414, and a second column booster drain region 415. The first column booster drain region 413 may serve as a source region of the first vertical column booster transistor, and may be used as a second column booster source region. When an activation voltage is applied to the first vertical column booster transistor gate 433, charges may move from the first column booster drain region 413 (i.e., the second source region) to the second column booster drain region 415 through the second column booster channel region 414.

When each of the first horizontal column booster signal CBSR1 and the first vertical column booster signal CBSC1 has an activation voltage, charges can move between the first column booster terminal 431 and the second column booster terminal 434, so that the first gain conversion transistor DCGX11 and the third gain conversion transistor DCGX21 may be electrically connected to each other.

The gain conversion transistors adjacent to each other in the column direction are connected to each other only when two column booster signals applied to the column booster block are simultaneously activated, so that connection or non-connection between the gain conversion transistors arranged in the column direction can be selectively determined.

Figure 5:
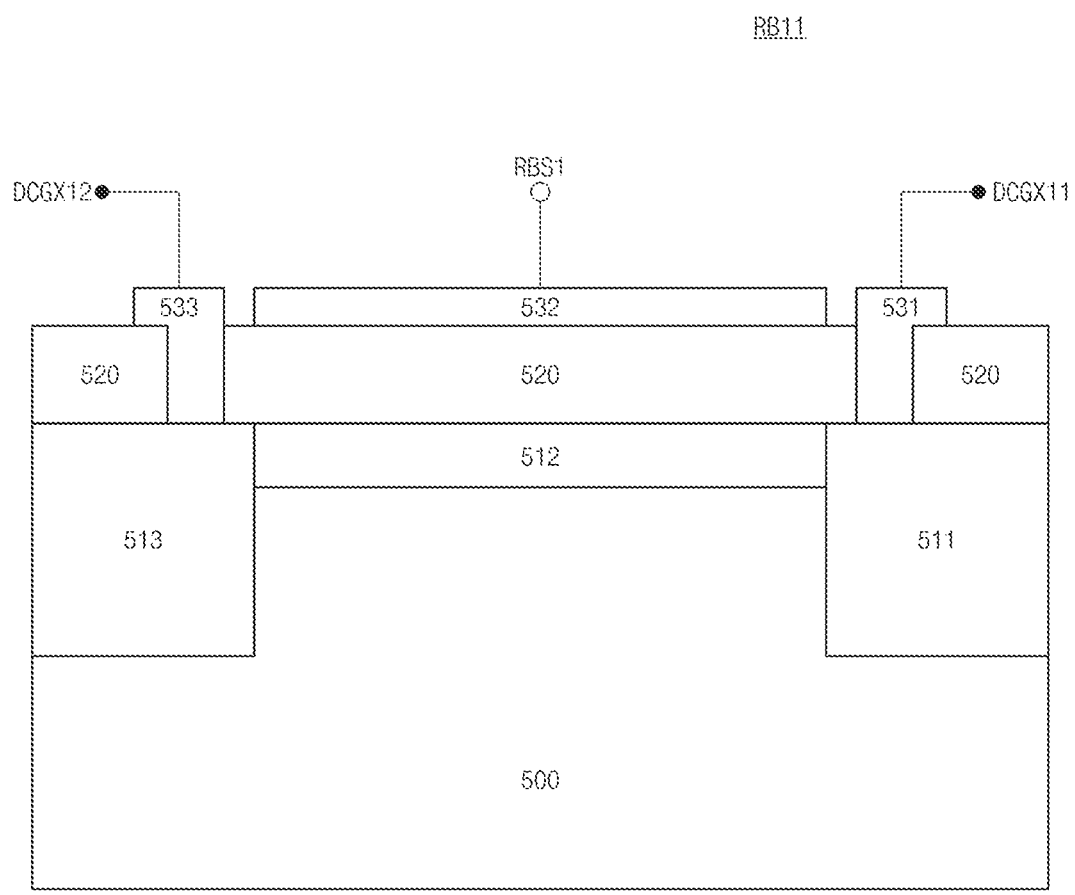
FIG. 5 is a cross-sectional view illustrating an example of a first row booster block based on some implementations of the disclosed technology.

FIG. 5 is a cross-sectional view illustrating an example of the first row booster block based on some implementations of the disclosed technology.

Although FIG. 5 exemplarily illustrates the cross-section of the first row booster block RB11, other row booster blocks (e.g., RB12, RB21, RB22) shown in FIG. 2 may have the same cross-section as in the first row booster block RB11.

The first row booster block RB11 may have a MOSFET structure.

The first row booster block RB11 may be formed over the semiconductor substrate 500. The semiconductor substrate 500 may include a silicon substrate doped with impurities or an epitaxial layer doped with impurities. For example, the semiconductor substrate 500 may be a region doped with P-type impurities.

The row booster source region 511 may be formed over the semiconductor substrate 500, and may be a region doped with conductivity-type impurities different from those of the semiconductor substrate 500. For example, the row booster source region 511 may be a region doped with N-type impurities.

The row booster channel region 512 may be formed to contact the row booster source region 511, and may be doped with the same conductivity type impurities as those of the row booster source region 511. The row booster channel region 512 may be doped at a lower density than the row booster source region 511.

The row booster drain region 513 may be doped with the same conductivity type impurities as those of the row booster source region 511. In addition, the row booster drain region 513 may be doped at the same density as the row booster source region 511.

A row booster insulation layer 520 may be formed over the source region, the drain region, and the channel region. For example, the row booster insulation layer 520 may include an insulation material such as silicon oxide.

The first row booster terminal 531 formed through the row booster insulation layer 520 may be formed to contact the row booster source region 511. The first row booster terminal 531 may include a conductive material, for example, a metal material or polysilicon. The first row booster terminal 531 may extend to one end of the row booster block RB11, and may be connected to the first gain conversion transistor DCGX11.

The row booster transistor gate 532 may be formed over the row booster insulation layer 520, and may include a conductive material. In some implementations, the row booster transistor gate 532 may be formed to overlap at least a portion of the row booster source region 511 and the row booster drain region 513.

A first row booster signal RBS1 may be applied to the row booster transistor gate 532, and a first row booster signal line may be connected to the row booster transistor gate 532 so that the first row booster signal RBS1 can be applied to the row booster transistor gate 532.

The second row booster terminal 533 may be formed through the row booster insulation layer 520, and may be in contact with the row booster drain region 513. The second row booster terminal 533 may include a conductive material, for example, a metal material or polysilicon. The second row booster terminal 533 may extend to the other end of the first row booster block RB11 so that the second row booster terminal 533 can be connected to the second gain conversion transistor DCGX12.

The row booster transistor may include a row booster source region 511, a row booster channel region 512, and a row booster drain region 513. When an activation voltage is applied to the row booster transistor gate 532, charges may move from the row booster source region 511 to the row booster drain region 513 through the row booster channel region 512.

When the first row booster signal RBS1 has an activation voltage, charges may move between the first row booster terminal 531 and the second row booster terminal 533, and the first gain conversion transistor DCGX11 and the second gain conversion transistor DCGX12 may be electrically connected to each other.

Since the gain conversion transistors adjacent to each other in the row direction are connected to each other only when the row booster signal applied to the row booster block is activated, connection or non-connection between the gain conversion transistors arranged in the row direction can be selectively determined.

FIG. 6 is a diagram illustrating tables for explaining a method for adjusting a conversion gain of the floating diffusion region based on some implementations of the disclosed technology.

FIG. 6 illustrates a change in capacitance based on devices connected to the first floating diffusion region FD11 of the first unit pixel (i.e., PX11 of FIG. 2) included in the pixel array described with reference to FIG. 2.

For convenience of description, it is assumed that capacitance of the gain conversion transistors is equal to capacitance of the floating diffusion regions, and this capacitance will hereinafter be denoted by C.

As can be seen from Table 1, when the first column booster block CB11 is deactivated, the capacitance change of the first floating diffusion region (i.e., FD11 of FIG. 2) in response to activation or deactivation of the first row booster block RB11 and the second row booster block RB12 may occur. In Table 1, it is assumed that the first gain conversion transistor (DCGX11 of FIG. 2) and the second gain conversion transistor (DCGX12 of FIG. 2) are activated.

When the first column booster block CB11 is deactivated, information as to whether connection or non-connection between devices included in the unit pixels adjacent to the first floating diffusion region FD11 can be determined based on activation or non-activation of the row booster block RB11, RB12, or the like.

For example, when the first row booster block RB11 and the second row booster block RB12 are deactivated, the first floating diffusion region FD11 and the first gain conversion transistor (i.e., DCGX11 of FIG. 2) are connected to each other, and capacitance of the first floating diffusion region FD11 may be denoted by 2C.

Also, when the first row booster block RB11 is activated and the second row booster block RB12 is deactivated, the second floating diffusion region FD12 and the second gain conversion transistor DCGX12 included in the second unit pixel (i.e., PX12 of FIG. 2) can be connected to the first floating diffusion region FD11. At this time, the sum of capacitances of four devices may be denoted by 4C.

Finally, when the first row booster block RB11 is activated and the second row booster block RB12 is deactivated, the first floating diffusion region FD11 may be formed to contact not only the second floating diffusion region FD12 and the second gain conversion transistor DCGX12 included in the second unit pixel PX12, but also the floating diffusion region and the gain conversion transistor included in another unit pixel adjacent to the second unit pixel PX12 in the row direction. At this time, the sum of capacitances of six devices may be denoted by 6C.

As can be seen from Table 2, when the first column booster block CB11 is activated, the capacitance change of the first floating diffusion region FD11 in response to activation or deactivation of the first row booster block RB11 and the second row booster block RB12 may occur. In Table 2, it is assumed that the first gain conversion transistor DCGX11, the second gain conversion transistor DCGX12, and the third gain conversion transistor DCGX21 are activated.

When the first column booster block CB11 is activated, devices included in the third unit pixel (i.e., PX21 of FIG. 2) adjacent to the first unit pixel PX11 in the column direction can be additionally connected to the first floating diffusion region FD11.

As the devices included in the unit pixels adjacent to each other in the column direction are additionally connected, the first floating diffusion region FD11 may obtain an additional capacitance. For example, when the first row booster block RB11 and the second row booster block RB21 are activated, the capacitance of the first floating diffusion region FD11 may be denoted by 12C.

The image sensing device based on some implementations of the disclosed technology can variably adjust the capacitance of the floating diffusion region according to whether the row booster block and the column booster block are activated. In addition, the devices may be selectively connected to the floating diffusion region, so that the capacitance of the floating diffusion region can be selectively adjusted.

Figure 7:
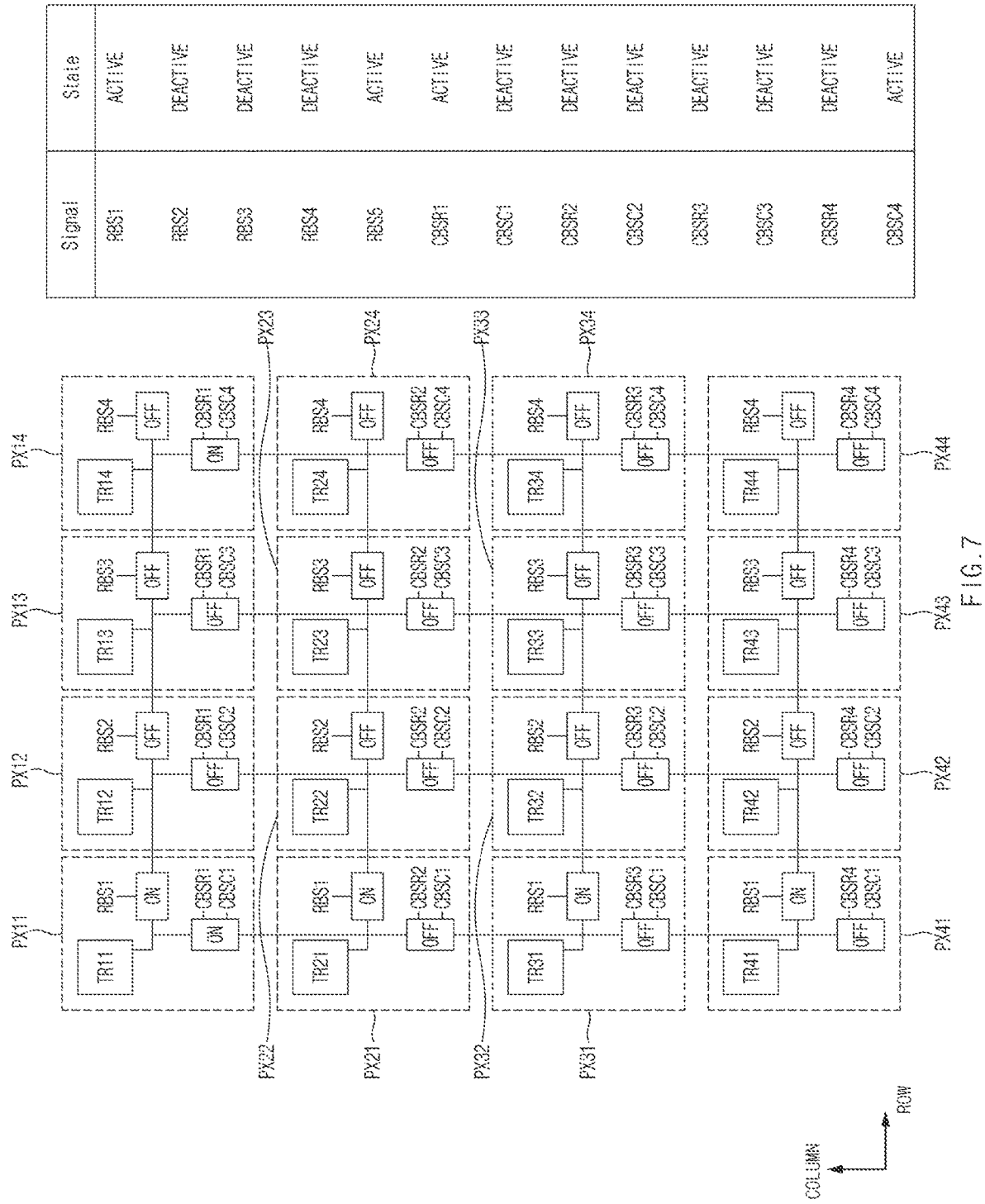
FIG. 7 is a diagram illustrating a difference in conversion gain between unit pixels based on some implementations of the disclosed technology.

FIG. 7 is a diagram illustrating a difference in conversion gain between the unit pixels based on some implementations of the disclosed technology.

FIG. 7 is a diagram for explaining that conversion gains of the unit pixels disposed in the pixel array can be adjusted differently. In more detail, FIG. 7 illustrates the connection relationship between the floating diffusion regions and the gain conversion transistors included in the unit pixels. In some implementations, the pixel signals output from the respective unit pixels can be output at different timing points.

For convenience of explanation, it is assumed that the gain conversion signals applied to the gain conversion transistors respectively included in the unit pixels PX11 to PX44 shown in FIG. 7 are all activated.

Further, when the unit pixels PX11 to PX44 are interconnected by the row booster blocks and the column booster blocks, it can be assumed that the signal blocks TR11 to TR44 respectively included in the unit pixels PX11 to PX44 are connected to each other.

FIG. 7 illustrates 16 unit pixels PX11 to PX44 constructing a (4×4) matrix array, signals applied to the row booster blocks respectively included in the unit pixels PX11 to PX44, and signals applied to the column booster blocks respectively included in the unit pixels PX11 to PX44.

Unlike the pixel array of FIG. 2, the unit pixels included in the pixel array shown in FIG. 7 may have a (4×4) matrix structure. In the (4×4) matrix structure shown in FIG. 7, a unit pixel PX11 located at a first-row-and-first-column position may be referred to as a first unit pixel, a unit pixel PX12 located at a first-row-and-second-column position may be referred to as a second unit pixel, a unit pixel PX13 located at a first-row-and-third-column position may be referred to as a third unit pixel, and a unit pixel located at a first-row-and-fourth-column position may be referred to as a fourth unit pixel PX14.

Similarly, in the (4×4) matrix structure shown in FIG. 7, the unit pixels PX21, PX22, PX23, and PX24 located at the second-row-and-first-column to second-row-and-fourth-column positions may be referred to as the fifth to eighth unit pixels, respectively, and other unit pixels PX31, PX32, PX33, and PX34 located at the third-row-and-first-column to third-row-and-fourth-column positions may be referred to as the ninth to twelfth unit pixels, respectively.

Finally, other unit pixels PX41, PX42, PX43, and PX44 located at fourth-row-and-first-column to fourth-row-and-fourth-column positions may be referred to as the thirteenth to sixteenth unit pixels, respectively.

The unit pixels PX11 to PX44 may include signal blocks TR11 to TR44, respectively. In addition, each of the unit pixels PX11 to PX44 may include a row booster block and a column booster block.

As shown in FIG. 2, each of the signal blocks TR11 to TR44 may include a photoelectric conversion region, a floating diffusion region, a transfer transistor, a drive transistor, a selection transistor, a reset transistor, etc.

Referring to FIG. 7, information as to whether the row booster block and the column booster blocks are activated according to the state of the row booster signal and the state of the column booster signal is displayed. When each of the row booster signal and the column booster signal has an activation voltage, "ACTIVE" may be displayed. When each of the row booster signal and the column booster signal has a deactivation voltage, "DEACTIVE" may be displayed.

As can be seen from FIG. 7, the activated row booster block or the activated column booster block may be displayed as "ON", and the deactivated row booster block or the deactivated column booster block may be displayed as "OFF".

Information as to whether the adjacent unit pixels are connected to each other may be determined according to activation or deactivation of the row booster block or the column booster block.

Referring to FIG. 7, when the first row booster signal RBS1 has an activation voltage, the signal blocks TR11, TR21, TR31, and TR41 respectively included in the unit pixels PX11, PX21, PX31, and PX41 located in the first column of the pixel array can be connected to the signal blocks TR21, TR22, TR23, and TR24 respectively included in the unit pixels PX21, PX22, PX23, and PX24 located in the second column.

When the column booster blocks are activated, unit pixels adjacent to each other in the column direction may be connected to each other. Information as to whether or not the column booster blocks are activated can be determined according to voltage levels of two column booster signals to be applied to the column booster blocks.

For example, the first column booster block CB11 may be activated when each of the first horizontal column booster signal CBSR1 and the first vertical column booster signal CBSC1 has an activation voltage, and signal blocks included in unit pixels adjacent to each other in the column direction may be connected to each other.

When the first column booster block CB11 included in the first unit pixel PX11 is activated, the first signal block TR11 included in the first unit pixel PX11 and the fifth signal block TR21 included in the fifth unit pixel PX21 may be connected to each other.

Although the column booster blocks are disposed in the same column or the same row, information as to whether the column booster blocks are activated can be determined independently, irrespective of the arrangement position of the column booster blocks.

For example, as shown in FIG. 7, when the activation state of the row booster signals RBS1, RBS2, and RBS3 and the activation state of the column booster signals CBSR1, CBSR2, CBSR3, CBSR4, CBSC1, CBSC2, CBSC3, and CBSC4 are determined, the first unit pixel PX11, the second unit pixel PX12, the fifth unit pixel PX21, and the sixth unit pixel PX22 may be connected to each other.

In addition, the third unit pixel PX13, the seventh unit pixel PX23, the eleventh unit pixel PX33, the twelfth unit pixel PX34, the fifteenth unit pixel PX43, and the sixteenth unit pixel PX44 may not be connected to adjacent unit pixels.

Here, the capacitance of the floating diffusion region included in the first unit pixel PX11 may be four times the capacitance of the third unit pixel PX13.

As described above, the capacitance of the floating diffusion regions respectively included in the unit pixels may vary depending on the activation state of the column booster blocks and the row booster blocks.

As described above, an HDR image may generally refer to an image generated when the plurality of pixel signals for the environment having different illuminances is obtained and the obtained signals are then processed and synthesized.

When the unit pixels in the pixel array have different capacitances, the HDR image can be acquired by only one photographing action.

In other words, the image sensing device according to the disclosed technology can adjust the floating diffusion regions respectively included in the unit pixels of the pixel array in a manner that the floating diffusion regions have different conversion gains, and can acquire pixel signals corresponding to different illumination environments by only one photographing action.

The image sensing device may generate an HDR image by synthesizing and calculating image data based on the pixel signal.

As is apparent from the above description, the image sensing device based on some implementations of the disclosed technology can sufficiently acquire a conversion gain of a floating diffusion region included in each unit pixel while miniaturizing the unit pixel.

In addition, the image sensing device based on some implementations of the disclosed technology can obtain a high dynamic range (HDR) image by adjusting a conversion gain of the floating diffusion region.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device comprising:
  a pixel array of a plurality of unit pixels arranged in a row direction and a column direction and including a first unit pixel that includes:
  a first floating diffusion region configured to store photocharge generated within the first unit pixel in corresponding to incident light;
  a first gain conversion transistor connected to the first floating diffusion region;
  a first row booster block connected to the first gain conversion transistor and a second gain conversion transistor that is included in a second unit pixel adjacent to the first unit pixel in the row direction; and
  a first column booster block connected to the first gain conversion transistor and a third gain conversion transistor that is included in a third unit pixel adjacent to the first unit pixel in the column direction.

2. The image sensing device according to claim 1, wherein:
  the first column booster block is configured to receive:
    a first horizontal column booster signal commonly applied to a plurality of column booster blocks respectively included in the plurality of unit pixels adjacent to each other in the row direction; and
    a first vertical column booster signal commonly applied to a plurality of column booster blocks respectively included in the plurality of unit pixels adjacent to each other in the column direction.

3. The image sensing device according to claim 2, wherein:
  the first row booster block is configured in a manner that a first row booster signal is commonly applied to a plurality of row booster blocks respectively included in the plurality of unit pixels adjacent to each other in the column direction.

4. The image sensing device according to claim 2, wherein:
in response to the first horizontal column booster signal having an activation voltage and the first vertical column booster signal having an activation voltage, the first column booster block electrically interconnects the first gain conversion transistor and the third gain conversion transistor.

5. The image sensing device according to claim 3, wherein:
in response to the first row booster signal having an activation voltage, the first row booster block electrically interconnects the first gain conversion transistor and the second gain conversion transistor.

6. The image sensing device according to claim 2, wherein the first column booster block includes:
a first horizontal column booster transistor configured to receive the first horizontal column booster signal as an input; and
a first vertical column booster transistor configured to receive the first vertical column booster signal as an input,
wherein one end of the first horizontal column booster transistor is connected to one end of the first vertical column booster transistor.

7. The image sensing device according to claim 6, wherein:
the first horizontal column booster transistor includes a first drain region and a first source region;
the first vertical column booster transistor includes a second drain region and a second source region; and
the first drain region and the second source region are identical to each other.

8. The image sensing device according to claim 1, wherein:
the first unit pixel includes four photoelectric conversion elements;
each of the photoelectric conversion elements is connected to the first floating diffusion region; and
the photoelectric conversion elements are arranged in a 2×2 matrix array.

9. The image sensing device according to claim 1, wherein:
capacitance of the first row booster block or the first column booster block is smaller than capacitance of the first gain conversion transistor, the second gain conversion transistor, or the third gain conversion transistor.

10. The image sensing device according to claim 1, wherein:
the second unit pixel includes a second floating diffusion region; and
the second floating diffusion region is connected to the second gain conversion transistor.

11. The image sensing device according to claim 1, wherein:
the third unit pixel includes a third floating diffusion region,
wherein the third floating diffusion region is connected to the third gain conversion transistor.

12. The image sensing device according to claim 1, wherein:
the first gain conversion transistor and the second gain conversion transistor are configured to receive the same signal as an input.

* * * * *